United States Patent [19]

Iwamoto

[11] Patent Number: 5,494,617

[45] Date of Patent: Feb. 27, 1996

[54] METHOD OF INDUCING PIEZOELECTRIC PROPERTIES IN POLYMERS

[75] Inventor: Nancy E. Iwamoto, Ridgecrest, Calif.

[73] Assignee: The United States of America as represented by the Secretary of the Navy, Washington, D.C.

[21] Appl. No.: 243,027

[22] Filed: May 16, 1994

[51] Int. Cl.⁶ .................................................. B29C 35/08
[52] U.S. Cl. ........................ 264/435; 264/288.4; 264/443
[58] Field of Search ............................... 264/22, 24, 27, 264/288.4

[56] References Cited

U.S. PATENT DOCUMENTS

| | | | |
|---|---|---|---|
| 3,691,264 | 9/1972 | Asahina | 264/22 |
| 3,878,274 | 4/1975 | Murayama et al. | 264/24 |
| 4,308,370 | 12/1981 | Fukada et al. | 526/255 |
| 4,346,505 | 8/1982 | Lemonon et al. | 29/25.35 |
| 4,349,502 | 9/1982 | Pae et al. | 264/22 |
| 4,390,674 | 6/1983 | Ward et al. | 526/255 |
| 4,434,114 | 2/1984 | Sprout, Jr. | 264/22 |
| 4,560,737 | 12/1985 | Yamamoto et al. | 264/22 |
| 4,668,449 | 5/1987 | Soni et al. | 264/22 |
| 4,800,048 | 1/1989 | Bloomfield et al. | 264/22 |
| 5,192,470 | 3/1993 | Wilson et al. | 264/22 |
| 5,254,296 | 10/1993 | Perlman | 264/22 |

*Primary Examiner*—Jeffery R. Thurlow
*Attorney, Agent, or Firm*—Melvin J. Sliwka; John Forrest

[57] ABSTRACT

An improved method of inducing piezoelectric properties in polymer films, such as polyvinylidene fluoride (PVDF) films and co-polymers thereof. This improved method involves applying uniaxial tensile forces to pre-aligned polymer films while simultaneously applying an electric poling field to the pre-aligned polymer films at room temperature to provide enhanced piezoelectric properties. This improved method does not require the use of heating equipment or temperature cycling equipment during the electric field poling of the polymer and thus represents a simpler and more cost efficient process of inducing piezoelectric properties in polymers.

8 Claims, No Drawings

METHOD OF INDUCING PIEZOELECTRIC PROPERTIES IN POLYMERS

BACKGROUND OF THE INVENTION

1. Field of the Invention

The present invention generally relates to piezoelectric polymers and more particularly to a method of inducing piezoelectric properties in polymers. The disclosed method provides a cost effective alternative to conventional electric field poling procedure of polymers. Specifically the present invention is a method of inducing piezoelectric properties in polymers at room temperatures using tensile poling methods.

2. Related Art

The piezoelectric effect in polymers such as polyvinylidene fluoride (PVDF) results from attaining specific directional dipole alignment along the polymer chain backbone. This is typically done by pre-aligning the polymer chains in a unidirectional manner, and then aligning the dipoles using an electric field. This later step is known as electric field poling. Electric field poling is a technique in which an electric field is applied to the polymer in a manner which orients the axes of crystallites in a preferred direction. Electric field poling of piezoelectric polymers is typically performed at elevated temperatures.

Much of the related art in this area has involved a method of inducing piezoelectric properties in PVDF films which included subjecting the PVDF films to stretching forces and then to a high electric field or corona charge at an elevated temperature to provide piezoelectric properties. Typically, such a method would yield piezoelectric constants in the range of approximately 30–35 pC/N, where C is Coulombs and N is Newton.

Another related method to induce piezoelectric properties in PVDF polymers is disclosed in U.S. Pat. No. 5,254,296. This disclosure reveals a method to increase the piezoelectric constant of PVDF films and co-polymers thereof up to about 60 pC/N when they are subjected to simultaneously stretching and corona poling with a poling field of about 0.55 MV/cm, a stretching ratio of about 4.5, and a poling temperature of approximately 80 degrees Celsius. Accordingly, most of the related art teaches methods of inducing piezoelectric properties in polymers at elevated poling temperatures.

It is believed that polyvinylidene fluoride (PVDF) films possess the highest values of piezoelectric constants of any known polymer. PVDF is semicrystalline and contains at least two stable forms, a polar form I containing beta-crystallites and a non-polar form II containing alpha-crystallites. The beta crystalline configuration has an extended all-trans polar conformation. The alpha crystalline configuration has a trans-gauche-trans-gauché non-polar conformation.

Efforts have been made to increase the dipole alignment by increasing the occurrences of the beta crystalline configuration within the polymer. Electric field poling at elevated temperatures converts the alpha crystalline configuration to the beta crystalline configuration and aligns dipoles giving rise to large polarizations. Increasing the beta crystalline configuration within the polymer has also been accomplished by incorporating temperature cycling procedures before and during the electric field poling. The conventional approach is to bring the temperature range of the polymer proximate to the glass transition temperature range. This is typically at or above 80 degrees Celsius. An electric field is then applied across the polymer which aligns the dipoles. The polymer is then quenched or otherwise cooled at a predetermined rate such that the polymer will stabilize with the new orientation and alignment of the dipoles.

SUMMARY OF THE INVENTION

The present invention is a method for inducing piezoelectric properties in polymer films which involves poling of the polymer film under uniaxial tensile stress at room temperatures. In particular, the present method comprises pre-aligning an amorphous polymer film by placing the polymer film under a uniaxial tension force and stressing the film to a predetermined stretching ratio. Electrodes are then deposited on the polymer film and the polymer film is subjected to a uniaxial tension force. An electric poling field is then applied to the polymer film for several hours at a poling temperature of approximately 22 degrees Celsius resulting in a polymer film having enhanced piezoelectric properties.

Accordingly, it is an object of the present invention to provide an improved method of treating polymer films, such as PVDF films and co-polymers thereof, that results in enhanced piezoelectric properties. This improved method involves applying uniaxial tensile forces to the polymer films while simultaneously poling these PVDF films at room temperature to provide an enhanced beta crystalline configuration.

An important advantage of the present invention is that the improved method does not require the use of heating equipment or temperature cycling equipment during the electric field poling of the polymer and thus represents a simpler and more cost efficient process of inducing piezoelectric properties in polymers.

An important feature of the present invention is that the improved method involves pre-aligning or pre-orienting the polymer film by placing the polymer film under a uniaxial tension force and stressing the film to approximately a 4.0 stretching ratio.

The disclosed method for inducing piezoelectric properties in polymers at room temperature using tensile poling methods realizes the aforementioned objects, features and advantages in a manner that is clearly evident from a thorough consideration of the drawings and detailed description that follows.

DETAILED DESCRIPTION

The piezoelectric effect involves the deformation of the polymer or other crystalline structure under the influence of an electric field. The reverse effect is also true in that certain polymers and other crystalline structures can create a voltage when subjected to mechanical stress. Since it is well known that dipole movement is directly involved in the piezoelectric effect, it follows that enhanced piezoelectric effects will be observed when the mechanical stresses imparted to the material are stresses which directly affect the dipole movement.

As discussed above, polyvinylidene fluoride (PVDF) films possess the highest values of piezoelectric constants of any known polymer. Efforts have been made to increase the dipole alignment by increasing the occurrences of the beta crystalline configuration within the polymer during electric field poling. In the beta crystalline configuration the dipoles are aligned in the same direction stabilized by the crystalline microstructure. One manner in accomplishing this is to raise the temperature of the polymer such that it approaches the glass transition temperature range. This is typically above 100 degrees Celsius. The polymer is then gradually cooled while simultaneously applying an electric field in order to align the dipoles in the same direction. Alternative approaches to increasing the beta crystalline configuration within the polymer can be accomplished by incorporating temperature cycling procedures before and during the electric field poling.

It is also important to remember that any response in a thin film polymer to mechanical stresses is conceptually different than the response arising in an inorganic crystalline lattices from the same mechanical stresses. Stress in the longitudinal direction or polymer chain direction involves stress of the covalent bonds. This stress of the strong covalent bonds in the polymer chain direction leads to dipole movement either in the form of rotational movement or chain twisting or both. Alternatively, any stress in the lateral direction mainly involves disruption of weaker dispersive forces within the polymer. This stress on the weak dispersive forces may or may not directly involve dipole movement.

The present invention is a result of various molecular modeling studies which revealed that simple stress applied along the polymer chain pulls the polymer fragment from an alpha crystalline form into a crystalline form that resembles the beta crystalline configuration. This study suggested that perhaps the conventional heating or temperature cycling of the piezoelectric polymer films during electric field poling could be replaced by simple stresses applied along the polymer chain while simultaneously exposing the polymer film to an electric field.

Another concern addressed by the present invention involves ensuring the stresses are applied along the polymer chains. In order to maximize the likelihood that most of the polymer chains are oriented in the same direction as the applied stresses, a preferred step is to pre-align the polymer film. Pre-aligning involves orienting most of the polymer back-bone chains in a uniform direction with respect to the thin film. For purposes of clarification, the direction of the predominant polymer chain orientation is referred to as the longitudinal direction. An example of a simple means of pre-aligning the polymer films is to pre-stretch the polymer films prior to attempting to induce piezoelectric properties in the polymer films. In addition, heating or temperature cycling of a pre-stretched polymer film may, to a limited extent, induce re-randomization of the polymer chain orientation which offsets the advantages gained by pre-stretching the polymer film.

Because the simple stresses applied in the polymer chain direction translate into longitudinal deformations which give rise to the piezoelectric effect in polymers, it is reasonable that the best response from polymeric materials will not arise from compression but rather from direct uniaxial tension or direct longitudinal deformation. By attempting further strain along the covalent bond direction through direct uniaxial tension, higher dipole movements may be expected. This larger dipole movement in the piezoelectric polymer causes a larger voltage signal. Accordingly, it can be shown that a piezoelectric polymer film subjected to direct uniaxial tension can produce higher voltages using less force than a comparable piezoelectric polymer film subjected to compression forces. Alternatively, a smaller sample of piezoelectric polymer functioning in tension would produce an equal voltage output to a much larger sample of piezoelectric sample functioning in compression.

Application of this principle to the electric field poling of polymer films allows an ability to induce enhanced piezoelectric properties in thin film polymers such as PVDF as well as other piezoelectric polymers such as polyvinylchloride (PVC), and polyvinylfluoride (PVF). Specifically, the present method has shown greater dipole movement during the electric field poling of a piezoelectric polymer if the polymer is simultaneously placed under uniaxial tension force at room temperature. The longitudinal stress and longitudinal strain on the polymer chain resulting from the uniaxial tensile force will accelerate and enhance the piezoelectric effect. When the tensile force is removed the polymer film will stabilize with the dipoles oriented in a uniform and predetermined direction.

The preferred method for inducing piezoelectric properties in PVDF and other polymer films involves electric field poling of the polymer film under uniaxial tensile stress in the longitudinal direction at room temperature. Specifically, the preferred method involved the following procedure:

Amorphous PVDF was prepared by dissolving the polymer in butyrolactone and casting in a petri dish. This mixture was then baked at 70 degrees Celsius for approximately 4–12 hours. A PVDF film with a thickness of approximately 0.003 inches was obtained.

This PVDF film was pre-aligned or pre-oriented by placing the PVDF film under a uniaxial tension force in and stressing the film to approximately a 4.0 stretching ratio. The tension force was released to yield a stabilized PVDF film with a thickness of approximately 0.001 inches. As a result of the pre-alignment, the PVDF back-bone chains are predominately oriented in a longitudinal direction.

Electrodes were then deposited on the PVDF film using conductive paint. Copper wire leads were then attached to the electrodes.

The PVDF film was then taped to a winch reel which held the PVDF film under a constant uniaxial tension force in the longitudinal direction.

An electric poling field of about 2 to 2.5 kV was applied to the PVDF film for several hours. The poling temperature was approximately 22 degrees Celsius.

This improved method of inducing piezoelectric properties yields PVDF films with superior piezoelectric properties as compared to similar PVDF films poled under compression forces and PVDF films poled with no external forces applied. The following Table summarizes the comparative test results.

TABLE 1

| | Comparative Test Results for Piezoelectric Polymers | | | |
| --- | --- | --- | --- | --- |
| | SAMPLE 1 | SAMPLE 2 | SAMPLE 3 | SAMPLE 4 |
| Polymer | PVDF (pre-stretched) | PVDF (pre-stretched) | PVDF | PVDF (pre-stretched) |
| Force Applied while Electric Field Poling | 250 g [Tension] | 250 g [Tension] | 500 psi [Compression] | 500 psi [Compression] |
| Temperature (°C.) | ~22° C. | ~22° C. | ~22° C. | ~22° C. |
| Electric Poling Field | 2.0–2.5 kV/cm | 2.0–2.5 kV/cm | 2.0–2.5 kV/cm | 2.0–2.5 kV/cm |

TABLE 1-continued

Comparative Test Results for Piezoelectric Polymers

|  | SAMPLE 1 | SAMPLE 2 | SAMPLE 3 | SAMPLE 4 |
|---|---|---|---|---|
| Test Force Applied | 2.5N | 4.0N | 4.0N | 4.0N |
| Induced Voltage | ⁻100 V | ⁻80 V | ⁻7 V | ⁻8 V |
| Sample thickness | 27.94 microns | 53.34 microns | 71.12 microns | 53.34 microns |
| Sample width | 1.0 cm | 1.0 cm | 1.0 cm | 1.0 cm |
| Electrode Area | 0.65 cm$^2$ | 0.65 cm$^2$ | 0.8 cm$^2$ | 0.65 cm$^2$ |
| Piezoelectric Constant | ⁻0.1719 V/N | ⁻0.1641 V/N | ⁻0.0156 V/N | ⁻0.0164 V/N |

The piezoelectric constants identified in Table 1 were determined using the following equation:

$$G_P = (Q/A_E) * (A_S/F)$$

where 'Q' is the induced charge resulting from an applied testing force, 'F' is the maximum applied testing force, '$A_E$' is the electrode area, and '$A_S$' is the cross sectional area of the piezoelectric polymer sample or alternatively the thickness of the piezoelectric polymer sample multiplied by the width of the piezoelectric polymer sample. For purposes of establishing the comparative piezoelectric constants, the maximum applied testing force 'F' was in the range of approximately 2 to 4 Newtons. The area of the electrode was in the range of 0.65 cm$^2$ to 0.80 cm$^2$, and the cross sectional area of the piezoelectric polymer samples was approximately $2.8 \times 10^{-4}$ to $7.1 \times 10^{-4}$ cm$^2$.

From the foregoing description, those skilled in the art will appreciate that all the objects, advantages and features of the present invention are realized. A method has been described for inducing piezoelectric properties in polymer films which involves electric field poling of the polymer film under uniaxial tensile stress at room temperatures.

While a specific method for inducing piezoelectric properties in polymer films has been shown and described, many variations are possible. For example, corona poling methods may be substituted for the electric field poling method. The family of polymers is by no way limited to PVDF and co-polymers thereof. The magnitude of the tensile forces, the magnitude of the electric field, and the dimensions of the polymer films may be altered to suit the particular application in which the method is employed. Those persons skilled in the art will appreciate that certain modifications may be made to the disclosed method without departing from its spirit, therefor it is not intended that the scope of the invention be limited to the specific method described. Rather, it is intended that the scope of this invention be determined by the appending claims and their equivalents.

What is claimed as the invention is:

1. A method of inducing piezoelectric properties in polymer films comprising the following steps:
    (a) first pre-aligning an amorphous polymer film such that most of the polymer chains are oriented in a uniform manner, whereby the film is placed under a uniaxial tension force which is then released to yield a stabilized film;
    (b) placing the polymer film under an approximately constant uniaxial tension force; and
    (c) simultaneously poling the polymer film using a low electric field at a poling temperature approximately equal to room temperature, whereby the process of heating the polymer is eliminated.

2. A method of inducing piezoelectric properties in polymer films of claim 1 wherein said low electric field is about 2 to 2.5 kV.

3. A method of inducing piezoelectric properties in polymer films comprising the following steps:
    (a) first pre-stretching an amorphous polymer film such that most of the polymer chains are oriented in a uniform manner, whereby the film is placed under a uniaxial tension force which is then released to yield a stabilized film;
    (b) placing the polymer film under an approximately constant uniaxial tension force in the polymer chain direction; and
    (c) simultaneously applying a low electric field poling process to the polymer film at a poling temperature approximately equal to room temperature, whereby the process of heating the polymer is eliminated.

4. A method of inducing piezoelectric properties in polymer films of claim 3 wherein said low electric field is about 2 to 2.5 kV.

5. The method of inducing piezoelectric properties in polymer films of claim 1 wherein the polymer film is a polyvinylidene fluoride (PVDF) film.

6. The method of inducing piezoelectric properties in polymer films of claim 1 wherein the polymer film is a co-polymer of polyvinylidene fluoride (PVDF).

7. The method of inducing piezoelectric properties in polymer films of claim 1 wherein the electric poling field is applied to the polymer film at a poling temperature of approximately 22 degrees Celsius.

8. The method of inducing piezoelectric properties in polymer films of claim 3 wherein the polymer film is a polyvinylidene fluoride (PVDF) film.

* * * * *